(12) United States Patent
Nguyen et al.

(10) Patent No.: US 6,477,103 B1
(45) Date of Patent: Nov. 5, 2002

(54) REPROGRAMMABLE FUSE AND METHOD OF OPERATING

(75) Inventors: Tam M. Nguyen, San Jose; Hung Q. Nguyen, Fremont; Thuc Bui, San Jose; Sang Thanh Nguyen, Union City, all of CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/960,544

(22) Filed: Sep. 21, 2001

(51) Int. Cl.[7] .................................................. G11C 7/00
(52) U.S. Cl. .............................. 365/225.7; 365/185.01; 365/203
(58) Field of Search .............................. 365/225.7, 204, 365/203, 185.01, 185.25, 185.26

(56) References Cited

U.S. PATENT DOCUMENTS 5,729,495 A * 3/1998 Madurawe ............. 365/185.18
5,933,039 A * 8/1999 Hui et al. .................... 327/262

* cited by examiner

*Primary Examiner*—David Nelms
*Assistant Examiner*—Thong Le
(74) *Attorney, Agent, or Firm*—Gray Cary Ware & Freidenrich LLP

(57) ABSTRACT

A reprogrammable fuse has a pair of non-volatile memory cells differentially programmed. The pair of non-volatile memory cells are connected to a pair of bitlines and through a pair of switches to a precharging voltage. The switches are controlled by a precharging and equalization signal, which when activated, serves to precharge the bitlines. The charged bitlines are then connected to the pair of differentially programmed non-volatile memory cells and one of the bitlines is discharged faster than the other. The resultant output is taken from one of the bitlines.

8 Claims, 1 Drawing Sheet

REPROGRAMMABLE FUSE AND METHOD OF OPERATING

TECHNICAL FIELD

The present invention relates to the field of reprogrammable fuses and more particularly to a reprogrammable fuse using a pair of non-volatile memory cells having floating gates for storing charges thereon in which the cells are differentially sensed.

BACKGROUND OF THE INVENTION

Reprogrammable fuses are well-known in the art. See, for example, U.S. Pat. No. 6,222,765 which discloses a non-volatile flip flop circuit in which a pair of non-volatile memory cells differentially store charges thereon. In addition, the two cells are connected to a volatile flip flop for faster access.

A non-volatile memory cell of the split gate floating gate type is also well-known in the art. See, for example, U.S. Pat. Nos. 5,029,130 and 5,572,054, whose disclosures are incorporated herein in their entirety by reference. As disclosed in these patents, the non-volatile memory cell comprises a first terminal and a second terminal with a channel therebetween. A floating gate is formed over a first portion of the channel and is insulated therefrom and is over a portion of the first terminal. The non-volatile memory cell also comprises a control gate which overlaps a second portion of the channel. The action of erase, programming, and read are disclosed in the aforementioned patents.

SUMMARY OF THE INVENTION

A reprogrammable fuse comprises a first and a second non-volatile memory cell. Each non-volatile memory cell is of the type having a first terminal and a second terminal in a substrate with a channel therebetween. Each of the first and second non-volatile memory cells has a floating gate for storing charges with the floating gate overlying a portion of the channel and is capacitively coupled to the first terminal. Each of the first and second non-volatile memory cells further has a control gate overlying a second portion of the channel and serves to remove charges stored on the floating gate. The fuse has a first bitline connected to the second terminal of the first non-volatile memory cell and a second bitline connected to the second terminal of the second non-volatile memory cell. A word line is commonly connected to the control gates of the first and second non-volatile memory cells. A source line is commonly connected to the first terminals of the first and second non-volatile memory cells. A precharging and equalization circuit is commonly connected to the second terminals of the first and second non-volatile memory cells. An output terminal is connected to one of the first or second bitlines for supplying an output signal indicative of the state of the fuse. The fuse is erased by supplying erase voltages to the word line and the source line. The fuse is programmed by supplying programming voltages to the source line, word line, and the first bitline and the second bitline wherein the fuse is programmed to one state or another state. When the fuse is programmed to one state, the floating gate of the first non-volatile memory cell stores more charges than the floating gate of the second non-volatile memory cell. When the fuse is programmed to another state, the floating gate of the first non-volatile memory cell stores less charges than the floating gate of the second non-volatile memory cell. The programmed state of the fuse is read by supplying a precharging voltage to the first and second bitlines with the first and second bitlines being differentially sensed.

DETAILED DESCRIPTION OF THE INVENTION

Figure 1:
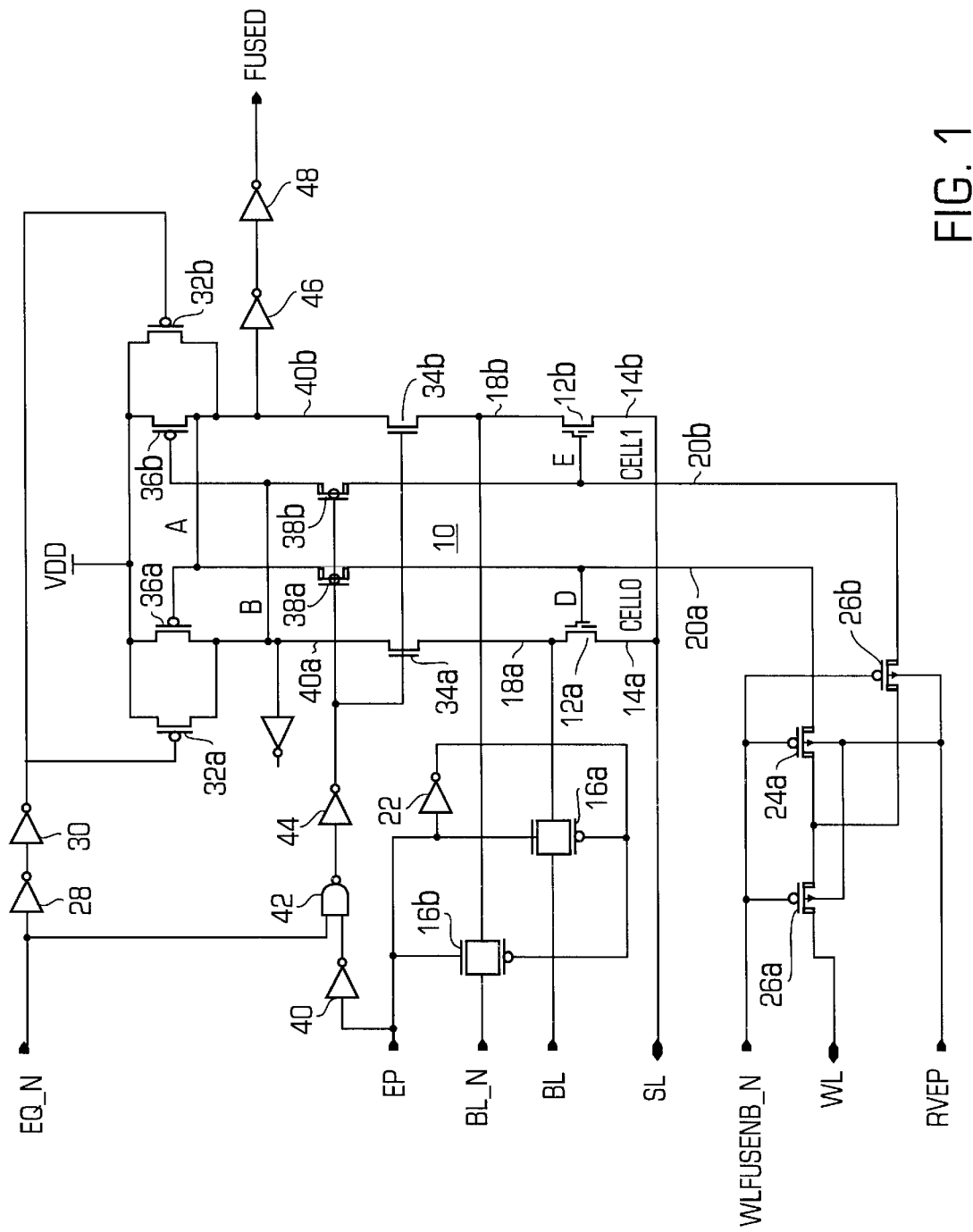
FIG. 1 is a circuit diagram of the reprogrammable fuse of the present invention.

Referring to FIG. 1 there is shown a circuit diagram of a reprogrammable fuse 10 of the present invention. The reprogrammable fuse 10 comprises a first non-volatile memory cell 12a and a second non-volatile memory cell 12b. Each of the first and second non-volatile memory cells 12a and 12b is of the type having a first terminal 14a and 14b and a second terminal 18a and 18b in a substrate with a channel therebetween. A floating gate stores charges and overlies a first portion of the channel and is capacitively coupled to the first terminals 14a and 14b. A control gate overlies a second portion of the channel and serves to remove charges stored on the floating gate and to control the conduction of current between the first terminal 14 and the second terminal 18. The connection to the control gates are designated as nodes D and E and are connected to the control gate lines 20a and 20b respectively.

Each of the first and second non-volatile memory cells 12a and 12b is of the type that is described in U.S. Pat. Nos. 5,029,130 and 5,572,054 whose disclosures are incorporated herein in their entirety by reference.

The first terminals 14a and 14b are commonly connected and received the signal SL. The control gate line 20a is connected to the signal WL through transistors 24a and 26a which are controlled by the signal WLFUSENB_N. The control gate line 20b is connected to the signal WL through the transistor 26b whose gate is also controlled by the WLFUSENB_N signal. Thus, when WLFUSENB_N is activated, the WL signal is supplied to both control gate lines 20a and 20b and to the control gate nodes D and E respectively.

The second terminals 18a and 18b of each of the non-volatile memory cells 12a and 12b are connected respectively through pass gates 16a and 16b respectively to the signals BL and BL_N. The pass gates 16a and 16b are controlled by the signal EP. The signal EP is supplied to one terminal of each of the pass gates 16a and 16b. The EP signal is also supplied to an inverter 22 which supplies the output thereof to the second gate of the pass gates 16a and 16b. Thus when the EP signal is activated, the pass gates 16a and 16b are activated permitting the signals BL and the BL_N to be supplied to the second terminals 18a and 18b respectively,.

An EQ_N signal is supplied to an inverter 28 which supplies as an output to a second inverter 30 which then supplies as its output to the gates of a pair of P-type MOS transistors 32a and 32b. Each of the P-type MOS transistors 32a and 32b is connected at a first terminal (source/drain) thereof to a voltage source VDD. The second terminals (drain/source) of the P-type MOS transistors 32a and 32b are connected to a first and second bitlines 40a and 40b respectively. The first and second bitlines 40a and 40b are connected respectively to the first terminals (source/drain) of a first N-type MOS transistor 34a and a second N-type MOS transistor 34b. The second terminal (drain/source) of the first N-type MOS transistor 34a and the second terminal (drain/source) of the second N-type MOS transistor 34b are connected to the second terminals 18a and 18b of the NVM cells 12a and 12b respectively. The gates of the N-type MOS transistor 34a and 34b are connected together and receive the output signal from an inverter 44. The inverter 44 receives as its input the output of a NAND gate 42. The NAND gate 42 receives as one of its input the signal EQ_N. The other input of the NAND gate 42 is the signal EP which is then inverted by an inverter 40 and whose output is then supplied to the input of the NAND gate 42.

The fuse 10 also comprises a second pair of P-type MOS transistors 36a and 36b. The second pair of P-type MOS transistors 36a and 36b have first terminals-(source/drain) connected to the voltage source VDD. The second terminals of the second pair of P-type MOS transistors 36a and 36b are connected to the first and second bitlines 40a and 40b respectively. The gates of the second pair of P-type MOS transistors 36a and 36b are connected to the first terminals (source/drain) of a second pair of N-type MOS transistors 38a and 38b. The second terminals (drain/source) of the second pair of N-type MOS transistors 38 and 38b are connected to the control gate lines 20a and 20b respectively. The gates of the second pair of N-type MOS transistors 38a and 38b are connected together and receive the output of the inverter 44. Further, the second terminals of the P-type MOS transistors 36a and 36b are cross coupled. Thus, the gate of the P-type MOS transistor 36a is connected to the second terminal of the P-type MOS transistor 36b. The gate of the P-type MOS transistor 36b is connected to the second terminal of the P-type MOS transistor 36a.

An output of the fuse 10 is supplied from the second bitline 40b between the second terminal of the P-type MOS transistor 36b and the first terminal of the N-type MOS transistor 34b. The output terminal is supplied to an inverter 46, whose output is supplied to yet another inverter 48 and is the output of the fuse 10.

In the operation of the reprogrammable fuse 10 the non-volatile memory cells 12a and 12b are first erased. This is accomplished by grounding the signal WLFUSENB_N thereby turning on transistors 24a, 26a and 26b. This supplies the WL signal to the control gate lines 20a and 20b respectively The WL signal is held high at approximately +12 volts. The signal SL, commonly connected to terminals 14a and 14b of the non-volatile memory cells 12a and 12b is grounded. Electrons that are stored on the floating gates of cells 12a and 12b are then Fowler-Nordheim tunneled onto the control gate lines 20a and 20b respectively. The floating gates are then erased.

Alternatively, the signal EP is held at high or approximately +5 volts, turning on the pass gates 16a and 16b. The signals BL and BL_N are held at ground. With WL at +12 volts, and with WLFUSENB_N high (>+12 volts), the control gates of NVM cells 12a and 12b are at the high voltage of +12 volts. This turn on the second portion of the channel ever which the control gates lie. The high positive voltage on the control gate capacitvely coupled to the floating gate also turns on the first portion of the channel over which the floating gate lies. This then causes the terminals 14a and 14b to reach ground.

The fuse 10 is then programmed in the following manner. The fuse 10 can be programmed into one of two states. In the first state, more electrons are stored on the floating gate of the non-volatile memory cell 12a than on the floating gate of the non-volatile memory cell 12b. In a second state, more electrons are stored on the floating gate of the non-volatile memory cell 12b than on the floating gate of the non-volatile memory cell 12a. To program the fuse 10 into the first state wherein more electrons are stored on the floating gate of the nonvolatile memory cell 12a, the commonly connected SL line is raised to approximately +10 volts. WLFUSENB_N is grounded, thereby turning on transistors 24a, 26a and 26b. The WL signal is raised to approximately 2 to 3 volts. The EP signal is held high at approximately +5 volts thereby turning on the pass gates 16a and 16b permitting the signals BL and BL_N to be supplied to the terminals 18a and 18b respectively. With EP at +5 volts, a zero volt is supplied to the input of the NAND gate 42 which causes the output of the NAND gate 42 to be high. This causes the output of the inverter 44 to be low, thereby turning off the N-type MOS transistors 34a, 34b, 38a and 38b. This isolates the terminals 18a and 18b, of non-volatile memory cells 12a and 12b respectively from the bitlines 40a and 40b respectively. In addition, the output of the inverter 44 isolates the voltage on the control gate lines 20a and 20b from reaching the gates of the transistors 36a and 36b and nodes B and A respectively.

To program electrons through the mechanism of hot election injection on the floating gate of the non-volatile memory cell 12a, the BL line is held low at approximately ground or slightly above ground. This causes electrons to be supplied from the terminal 18a and into the channel between the terminal 18a and 14a and to be injected onto the floating gate of the non-volatile memory cell 12a. The voltage on the signal BL_N is held at approximately 2–3 volts or at least above the voltage of the control gate line 20b minus Vth. In that case, electrons will not traverse into the channel between the terminals 18b and 14b.

To program the fuse 10 into the other state, the voltages on BL_N and BL are reversed. In that event, BL_N is at ground whereas BL is held positive such that no electron would migrate into the channel between the terminal 18a and 14a. During the programming mode, the signal EQ_N is held high. This turns off the transistors 32a and 32b from connecting the bitlines 40a and 40b to the voltage VDD.

During the read operation, WLFUSEN_B is held high thereby shutting off transistors 24a, 26a and 26b. This prevents the signal WL from being supplied to the control gates of the non-volatile memory cells 12a and 12b. The commonly connected signal SL is held at ground, thereby grounding the terminals 14a and 14b. The signal EP is held at low or ground thereby turning off the pass gates 16a and 16b. Thus, signals BL_N and BL are not connected to the terminals 18a and 18b. With EP at low, the output of the inverter 40 is high. In the read mode, initially, the signal EQ_N is held low. With EQ_N at low, the output of the NAND gate 42 is high resulting in a low output from the inverter 44 turning off the transistors 34a, 34b, 38a and 38b. This disconnects the terminals 18a and 18b from the bitlines 40a and 40b. In addition, this disconnects nodes B and A from the control gate lines 20a and 20b and the control gates of the non-volatile memory cells 12a and 12b respectively. With EQ_N at low, the output of the inverter 30 is also low. However, this turns on the P-type MOS transistors 32a and 32b. This causes VDD to be supplied to the bitlines 40a and 40b. With bitlines 40a and 40b high, transistors 36a and 36b are turned off. Thus, bitlines 40a and 40b are first precharged.

After the precharging action, the signal EQ_N is brought high. Again, the signal EP remains low. With EP low, the output of the inverter 40 is high. With EQ_N also high, the output of the NAND gate 42 is low. This results in a high output from the inverter 44. With the output of the inverter 44 at high, transistors 34a and 34b are turned on connecting the bitlines 40a and 40b to the terminals 18a and 18b respectively. In addition, with the output of the inverter 44 high, the N-type MOS transistors 38a and 38b are turned on thereby connecting the precharged node of the bitlines 40a and 40b to the control gates D and E respectively of the non-volatile memory cells 12a and 12b, respectively. Depending on the state in which the fuse 10 is programmed, one of two actions can occur. In one action, non-volatile memory cell 12a conducts more readily than the non-volatile memory cell 12b. In that event, the voltage on bitline 40a will lower quicker than the voltage on the bitline 40b. With 40b remaining at a higher voltage level than 40a, the control gate of the non-volatile memory cell 12a will be turned on harder than the control gate on the non-volatile memory cell 12b. In addition, as the voltage on bitline 40a is lowered faster than the voltage on the bitline 40b P-type MOS transistor 36b is turned on faster than the P-type MOS transistor 36a. This further replenishes the voltage on the bitline 40b faster than the voltage on the bitline 40a. In a second state, the actions are reversed and the voltage on bitline 40b is lowered faster than the voltage on the bitline 40a. In either event, the output is detected at the output of the inverter 48. If the bitline 40b in one state remains at a higher voltage than bitline 40a, the output of the inverter 48 would be high. If the voltage on bitline 40b is drained faster than the voltage on bitline 40a, when the voltage on bitline 40a reaches ground, the output of the inverter 48 would be ground.

What is claimed is:

1. A reprogrammable fuse comprising:

a first non-volatile memory cell of the type having a first terminal and a second terminal in a substrate with a channel therebetween, a floating gate for storing charges and overlying a first portion of said channel and capacitively coupled to said first terminal, and a control gate overlying a second portion of said channel and for removing charges stored on said floating gate;

a second non-volatile memory cell of the type having a first terminal and a second terminal in a substrate with a channel therebetween, a floating gate for storing charges and overlying a first portion of said channel and capacitively coupled to said first terminal, and a control gate overlying a second portion of said channel and for removing charges stored on said floating gate;

a first bitline connected to the second terminal of said first non-volatile memory cell;

a second bitline connected to the second terminal of said second non-volatile memory cell;

a word line commonly connected to said control gates of said first and second non-volatile memory cells;

a source line commonly connected to said first terminals of said first and second non-volatile memory cells;

a precharging and equalization circuit commonly connected to said second terminals of said first and second non-volatile memory cells; and an output terminal connected to one of said first or second bitlines for supplying an output signal indicative of the state of said fuse;

wherein said fuse is erased by supply erase voltages to said word line and said source line; and wherein said fuse is programmed by supplying programming voltages to said source line, word line, and said first bitline and said second bitline, wherein said fuse is programmed to one state when said floating gate of said first non-volatile memory cell stores more charges than said floating gate of said second non-volatile memory cell; and wherein said fuse is programmed to another state when said floating gate of said first non-volatile memory cell stores less charges than said floating gate of said second non-volatile memory cell; and wherein the programmed state of said fuse is read by supplying a precharging voltage to said first and second bitlines and differentially sensing said first and second bitlines.

2. The reprogrammable fuse of claim 1 wherein in one state said programming voltages cause hot channel electrons to be injected onto the floating gate of said first non-volatile memory cell but not onto the floating gate of said second non-volatile memory cell; and in another state said programming voltages cause hot channel electrons to be injected onto the floating gate of said second non-volatile memory cell but not onto the floating gate of said first non-volatile memory cell.

3. The reprogrammable fuse of claim 1 wherein said erase voltages cause Fowler-Nordheim tunneling of electrons from said floating gates of said first and second non-volatile memory cells to its associated control gates.

4. The reprogrammable fuse of claim 1 wherein said precharging and equalization circuit further comprising:

a first pair of transistors, serially connected and having a first end and a second end and for connecting to said first bitline at one end thereof, and to a precharging voltage at said second end thereof, a second pair of transistors, serially connected and having a first end and a second end and for connecting to said second bitline at one end thereof, and to said precharging voltage at said second end thereof;

said output terminal being connected between said second pair of transistors; and said first and second pair of transistors being controlled by an equalization signal.

5. The reprogrammable fuse of claim 4 wherein said first pair of transistors comprises a first N type transistor and a first P type transistor, each of said first N type transistor and first P type transistor having a first terminal, a second terminal with a channel therebetween, and a gate for controlling the flow of current between the first terminal and the second terminal, with said first terminal of said first N type transistor connected to said first bitline, said second terminal of said first N type transistor connected to said first terminal of said first P type transistor, and with said second terminal of said first P type transistor connected to said precharging voltage;

said second pair of transistors comprises a second N type transistor and a second P type transistor, each of said second N type transistor and second P type transistor having a first terminal, a second terminal with a channel therebetween, and a gate for controlling the flow of current between the first terminal and the second terminal, with said first terminal of said second N type transistor connected to said second bitline, said second terminal of said second N type transistor connected to said first terminal of said second P type transistor, and with said second terminal of said second P type transistor connected to said precharging voltage;

wherein said equalization signal having two states: a first state for turning on said first and second P type transistors and turning off said first and second N type transistors, thereby precharging said first and second bitlines; a second state for turning off said first and second P type transistors and turning on said first and second N type transistors thereby connecting said first and second bitlines to said first and second non-volatile memory cells respectively.

6. The reprogrammable fuse of claim 5 further comprising:

a third P type transistor connected in parallel with said first P type transistor, said third P type transistor having a first terminal, a second terminal with a channel therebetween, and a gate for controlling the flow of current between the first terminal and the second terminal, with said second terminal of said third P type transistor connected to said precharging voltage and said first terminal of said third P type transistor connected to said first terminal of said first P type transistor;

a fourth P type transistor connected in parallel with said second P type transistor, said fourth P type transistor having a first terminal, a second terminal with a channel therebetween, and a gate for controlling the flow of current between the first terminal and the second terminal, with said second terminal of said fourth P type transistor connected to said precharging voltage and said first terminal of said fourth P type transistor connected to said first terminal of said second P type transistor;

said gate of said third P type transistor connected to said first terminal of said fourth P type transistor; and said gate of said fourth P type transistor connected to said first terminal of said third P type transistor.

7. The reprogrammable fuse of claim 6 further comprising:

a third N type transistor, said third N type transistor having a first terminal, a second terminal with a channel therebetween and a gate for controlling the flow of current between said first and second terminals, said second terminal of said third N type transistor connected to the gate of said third P type transistor;

a fourth N type transistor, said fourth N type transistor having a first terminal, a second terminal with a channel therebetween and a gate for controlling the flow of current between said first and second terminals, said second terminal of said fourth N type transistor connected to the gate of said fourth P type transistor;

said gate of said third and fourth N type transistors connected together to receive said equalization signal;

said first terminals of said third and fourth N type transistors connected to said control gates of said first and second non-volatile memory cells, respectively.

8. A method of programming and reading a reprogrammable fuse; said method comprising the steps of:

erasing a pair of non-volatile memory cells, each non-volatile memory cell having a floating gate for storing charges thereon; each of said pair of non-volatile memory cells connected to a bitline for reading the state of the connected memory cell determined by the amount of charges stored on the associated floating gate;

programming said reprogrammable fuse to a first state by storing more charges on said floating gate of one of said pair of non-volatile memory cells than the other; or to a second state by storing more charges on said floating gate of the other of said pair of non-volatile memory cells than the one;

precharging the bitlines associated with the pair of non-volatile memory cells; and differentially sensing the bitlines by connecting the precharged bitlines to said pair of non-volatile memory cells.

* * * * *

UNITED STATES PATENT AND TRADEMARK OFFICE
CERTIFICATE OF CORRECTION

PATENT NO. : 6,477,103 B1  
DATED : November 5, 2002  
INVENTOR(S) : Nguyen et al.

It is certified that error appears in the above-identified patent and that said Letters Patent is hereby corrected as shown below:

<u>Title page,</u>
Item [75], the patent incorrectly lists the name and city of inventor "Hung Nguyen" as "Hung Q. Nguyen, Fremont." please amend to read:
-- Hung T. Nguyen, Santa Clara. --

Signed and Sealed this

Twenty-fourth Day of June, 2003

JAMES E. ROGAN
*Director of the United States Patent and Trademark Office*